(12) United States Patent
Kang et al.

(10) Patent No.: US 9,136,010 B2
(45) Date of Patent: Sep. 15, 2015

(54) METHOD FOR GENERATING PHYSICAL IDENTIFIER IN STORAGE DEVICE AND MACHINE-READABLE STORAGE MEDIUM

(75) Inventors: Bo-Gyeong Kang, Seoul (KR);
Jung-Wan Ko, Gyeonggi-do (KR);
Soo-Hwan Choi, Gyeonggi-do (KR);
Sung-Hee Hwang, Gyeonggi-do (KR);
Byung-Rae Lee, Seoul (KR)

(73) Assignee: Samsung Electronics Co., Ltd (KR)

( * ) Notice: Subject to any disclaimer, the term of this patent is extended or adjusted under 35 U.S.C. 154(b) by 841 days.

(21) Appl. No.: 13/085,052

(22) Filed: Apr. 12, 2011

(65) Prior Publication Data

US 2011/0252189 A1    Oct. 13, 2011

(30) Foreign Application Priority Data

Apr. 12, 2010   (KR) .................. 10-2010-0033549
May 7, 2010     (KR) .................. 10-2010-0043230

(51) Int. Cl.
    *G06F 12/00*      (2006.01)
    *G11C 16/34*      (2006.01)
    (Continued)

(52) U.S. Cl.
    CPC ........ *G11C 16/3418* (2013.01); *G06F 12/0246* (2013.01); *G11C 16/20* (2013.01);
    (Continued)

(58) Field of Classification Search
    CPC ............ G06F 11/2064; G06F 11/2074; G06F 11/1451; G06F 11/1456; G06F 11/1469; G06F 11/1458; G06F 11/1461; G06F 11/2071; G06F 11/2082; G06F 11/08; G06F 11/1008; G06F 11/1417; G06F 11/1435; G06F 11/1448; G06F 11/1464; G06F 11/2058; G06F 11/2069; G06F 11/2221; G06F 11/1263; G06F 17/30982; G06F 17/11; G06F 17/30088; G06F 17/30091; G06F 17/3028; G06F 17/30592; G06F 3/0607; G06F 3/0616; G06F 3/0629; G06F 3/064; G06F 3/0647; G06F 3/0653; G06F 3/0679; G06F 3/0688; G06F 21/564; G06F 21/72; G06F 21/80; G06F 21/85; G06F 2201/855; G06F 2201/815; G06F 2201/82; G06F 2201/835; G06F 12/0811; G06F 12/0864; G06F 2211/1028; G06F 2212/7209; G06F 2221/2107; G06F 9/4408; G06F 11/2094; G06F 3/0632; G06F 3/0643; G06F 12/0246; G06F 12/00; G06F 2212/2022
    USPC .................. 711/103, 162, E12.008, 170, 154, 711/E12.001, E12.078, E12.103
    See application file for complete search history.

(56) References Cited

U.S. PATENT DOCUMENTS 5,412,718 A       5/1995  Narasimhalu et al.
5,537,585 A  *    7/1996  Blickenstaff et al. ................ 1/1
(Continued)

FOREIGN PATENT DOCUMENTS

CN   101471141   7/2009
CN   101632131   1/2010
(Continued)

*Primary Examiner* — Tuan Thai
*Assistant Examiner* — Edward Waddy, Jr.
(74) *Attorney, Agent, or Firm* — The Farrell Law Firm, P.C.

(57) ABSTRACT

A method and system for generating a physical identifier in a storage device that includes a plurality of storage regions is provided. The method includes determining a number of reference storage regions for uniquely identifying the storage device; comparing the number of reference storage regions to a threshold; generating auxiliary storage regions for uniquely identifying the storage device, such that a number of the auxiliary storage regions corresponds to a result of the comparison; generating location distribution information of the reference storage regions and auxiliary storage regions; and storing the location distribution information in the storage device.

15 Claims, 4 Drawing Sheets

(51) Int. Cl.
*G06F 12/02* (2006.01)
*G11C 16/20* (2006.01)
*G11C 29/42* (2006.01)
*G11C 29/44* (2006.01)
*G11C 16/00* (2006.01)

(52) U.S. Cl.
CPC ............ *G11C 16/349* (2013.01); *G11C 29/42* (2013.01); *G11C 29/44* (2013.01); *G06F 2212/7209* (2013.01); *G11C 16/00* (2013.01); *G11C 2029/4402* (2013.01)

(56) References Cited

U.S. PATENT DOCUMENTS

| | | | |
|---|---|---|---|
| 5,615,061 A | | 3/1997 | Singh |
| 5,982,886 A | | 11/1999 | Itami et al. |
| 6,058,047 A | * | 5/2000 | Kikuchi .................. 365/185.33 |
| 6,363,462 B1 | * | 3/2002 | Bergsten ...................... 711/162 |
| 8,255,705 B2 | * | 8/2012 | Starr et al. ..................... 713/193 |
| 8,281,066 B1 | * | 10/2012 | Trimmer et al. ............... 711/103 |
| 8,332,601 B2 | * | 12/2012 | Yasuda et al. ................. 711/162 |
| 8,365,026 B2 | | 1/2013 | Wang et al. |
| 2002/0064281 A1 | | 5/2002 | Ishizaka |
| 2002/0069322 A1 | * | 6/2002 | Galbraith et al. ............... 711/113 |
| 2005/0071436 A1 | * | 3/2005 | Hsu et al. ....................... 709/212 |
| 2008/0209294 A1 | | 8/2008 | Brink et al. |
| 2009/0010073 A1 | | 1/2009 | Kim et al. |
| 2009/0113145 A1 | * | 4/2009 | Slater et al. .................... 711/154 |
| 2009/0158044 A1 | | 6/2009 | Kirovski |
| 2009/0172482 A1 | | 7/2009 | Wang et al. |
| 2009/0222415 A1 | * | 9/2009 | Mimatsu et al. ................. 707/3 |
| 2010/0106909 A1 | * | 4/2010 | Kottomtharayil et al. ..... 711/115 |
| 2010/0122148 A1 | * | 5/2010 | Flynn et al. ..................... 714/773 |
| 2010/0161919 A1 | * | 6/2010 | Dodgson et al. ............... 711/161 |
| 2010/0169661 A1 | * | 7/2010 | Summers et al. ............... 713/189 |
| 2010/0228907 A1 | * | 9/2010 | Shen .............................. 711/103 |
| 2010/0235605 A1 | * | 9/2010 | Perry et al. ..................... 711/170 |
| 2010/0262765 A1 | * | 10/2010 | Cheon et al. ................... 711/103 |
| 2010/0262766 A1 | * | 10/2010 | Sprinkle et al. ................ 711/103 |
| 2010/0332923 A1 | * | 12/2010 | D'Abreu et al. ............... 714/708 |

FOREIGN PATENT DOCUMENTS

| | | |
|---|---|---|
| JP | 05-266576 | 10/1993 |
| JP | 2002-278934 | 9/2002 |
| JP | 2003-263371 | 9/2003 |
| JP | 2006-277888 | 10/2006 |
| JP | 2008-176607 | 7/2008 |
| JP | 2008-176707 | 7/2008 |

* cited by examiner

METHOD FOR GENERATING PHYSICAL IDENTIFIER IN STORAGE DEVICE AND MACHINE-READABLE STORAGE MEDIUM

PRIORITY

This application claims priority under 35 U.S.C. §119(a) to Korean Patent Applications entitled "Method for Generating Physical Identifier in Storage Device and Machine-Readable Storage Medium" filed in the Korean Industrial Property Office on Apr. 12, 2010 and May 7, 2010 assigned Serial Nos. 10-2010-0033549 and 10-2010-0043230, respectively, the contents of which are incorporated herein by reference.

BACKGROUND OF THE INVENTION

1. Field of the Invention

The present invention relates generally to a method and an apparatus for identification or authentication of a subject device, and more particularly to an apparatus and a method of generating a physical identifier for an authentication of a storage device.

2. Description of the Related Art

As technologies such as a Digital Rights Management (DRM) and a copy protection become necessary in order to protect contents, technologies for authenticating storage devices including a Non-Volatile Memory (NVM) device (e.g., a Solid State Disk (SSD), a flash memory card, etc.) that store such contents, also become necessary in order to implement the copy protection. More specifically, technology for verifying the suitability of various aspects of HardWare (H/W) of the storage device, as well as verifying encryption technology of the content itself, has become necessary.

CPRM (Content Protection for Recordable Media), which is a DRM technology for an SD (Secure Digital) card, and AACS (Advanced Access Content System), which is a DRM technology for Blu-ray® discs, provide a Public Key Infrastructure (PKI) or an authentication method for a storage device using other cryptographic technologies. However, such a Public Key Infrastructure (PKI) or authentication method do not prevent duplication of the storage device itself.

The conventional chip design has a technology capable of identifying problematic H/W by inserting a watermark or a fingerprint in a chip of the H/W. However, this technology is merely used for detecting security piracy after the piracy has already occurred. Therefore, the technology has disadvantages in that the technology cannot prevent the duplication in advance, is inefficient in mass production, and is difficult to be used for verifying the suitability of a device in a transaction point (i.e., at the time and location of a specified transaction).

Due to these disadvantages, contents providers take a passive attitude toward the possibility of establishing a business for distributing contents through hardware such as a flash memory card, etc.

SUMMARY OF THE INVENTION

Accordingly, the present invention addresses at least one of the above-stated problems and/or disadvantages.

The present invention also provides a method that can prevent a duplication in advance, is efficient in mass production, and can verify the suitability of the device at a transaction point.

In accordance with an aspect of the present invention, there is provided a method for generating a physical identifier in a storage device including a plurality of storage regions. The method includes determining a number of reference storage regions for uniquely identifying the storage device; comparing the number of reference storage regions to a threshold; generating auxiliary storage regions for uniquely identifying the storage device, such that a number of the auxiliary storage regions corresponds to a result of the comparison; generating location distribution information of the reference storage regions and auxiliary storage regions; and storing the location distribution information in the storage device.

In accordance with another aspect of the present invention, there is provided a machine-readable storage medium recording a program for execution of a method for generating a physical identifier in a storage device. The method includes determining a number of reference storage regions for uniquely identifying the storage device; comparing the number of reference storage regions to a threshold; generating auxiliary storage regions for uniquely identifying the storage device, such that a number of the auxiliary storage regions corresponds to a result of the comparison; generating location distribution information of the reference storage regions and auxiliary storage regions; and storing the location distribution information in the storage device.

In accordance with another aspect of the present invention, there is provided a system for generating a physical identifier. The system includes a storage device including a plurality of storage regions; and at least one controller for determining a number of reference storage regions for uniquely identifying the storage device, comparing the number of reference storage regions to a threshold, generating auxiliary storage regions for uniquely identifying the storage device, such that a number of the auxiliary storage regions corresponds to a result of the comparison, generating location distribution information of the reference storage regions and auxiliary storage regions, and storing the location distribution information in the storage device.

DETAILED DESCRIPTION OF EMBODIMENTS OF THE PRESENT INVENTION

Hereinafter, embodiments of the present invention are described with reference to the accompanying drawings. In the following description, a detailed explanation of known related functions and constitutions may be omitted to avoid unnecessarily obscuring the subject matter of the present invention.

When contents having a high value are sold or rented through a storage device or a memory device, an anti-cloning technology, by which the H/W is prevented from being illegally duplicated in large quantities, may be provided. In order to make it more difficult to perform a H/W duplication attack, it is desirable to use an intrinsic property or characteristic (i.e., a physical property or characteristic having a low collision probability) included in each of the storage devices in order to implement the anti-cloning technology.

For example, such a physical property may be a physical defect such as a bad block (i.e., a block having errors, such as programming, erasing, or read errors) or a fail cell (or a bad cell).

However, as manufacturing processes of various storage devices have developed, the frequency of occurrence of the bad blocks has been gradually decreasing, and therefore, some current products do not include any bad blocks.

An embodiment of present invention provides a method for generating a physical identifier (e.g., location distribution of a bad block or a fail cell) in order to use the intrinsic physical property of the storage device, and the method for generating a physical identifier by using One Time Programmable (OTP) regions or blocks. In the following description, the present invention generates a pseudo physical identifier by using the OTP regions. Also, as described in detail hereinafter, in general, the term "physical identifier" herein refers to an indication for uniquely identifying each of the storage devices. According to embodiments of the present invention, the physical identifier is generated through an artificial physical defect, random OTP regions, or a combination of the artificial defect and the random OTP regions. The pseudo physical identifier is an indication by which each of the storage devices is uniquely identified, but is not a physical defect. Hereinafter, the term "physical identifier," as used herein, is defined such that pseudo physical identifiers are also considered to be physical identifiers. Further, the pseudo physical identifier can be combined with the physical defect. For example, the pseudo physical identifier may include information regarding the physical defect (e.g. a fail cell pattern or location distribution).

Figure 1:
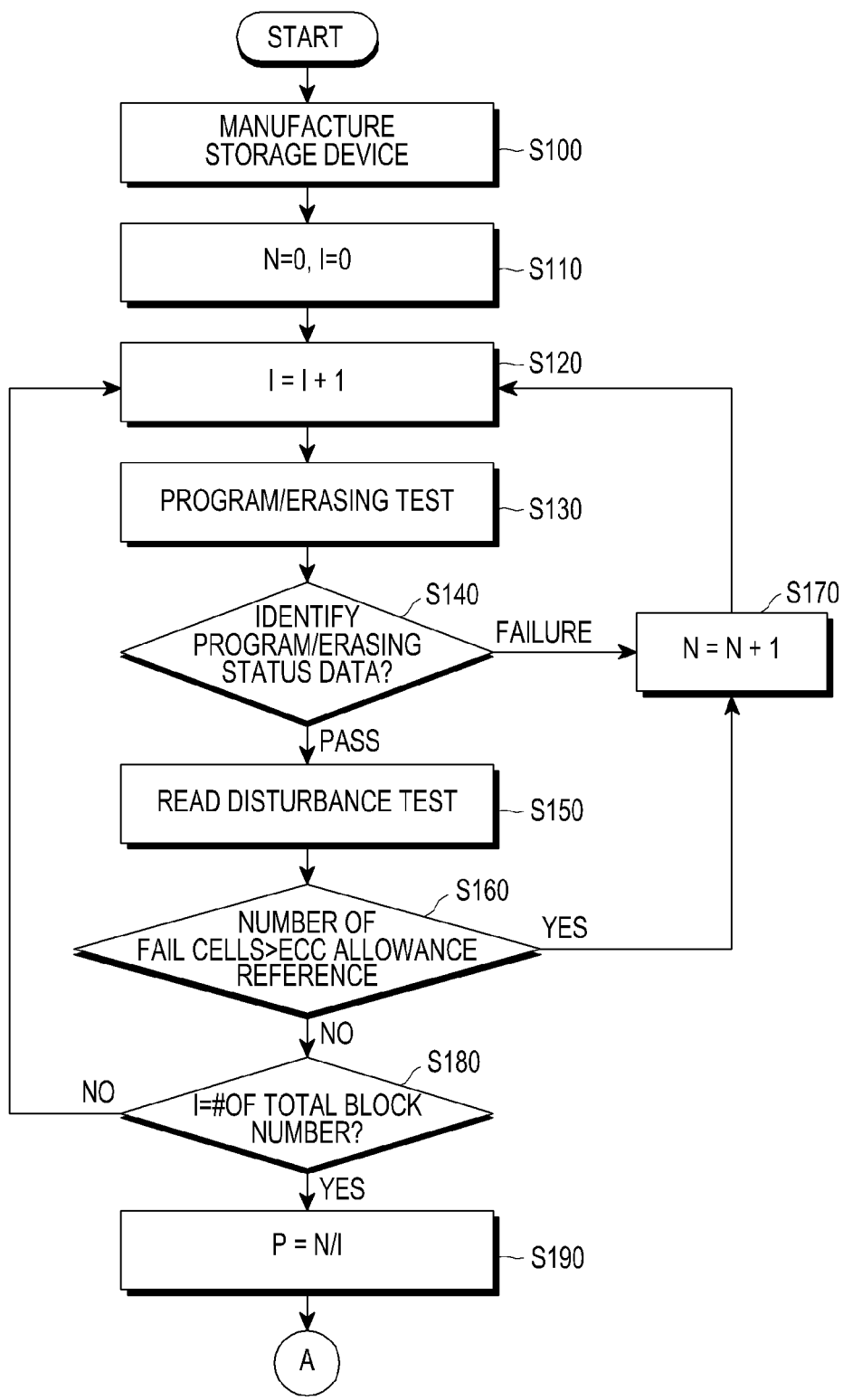
FIGS. 1 and 2 are flowcharts illustrating a method for generating a physical identifier according to an embodiment of the present invention.
Figure 2:
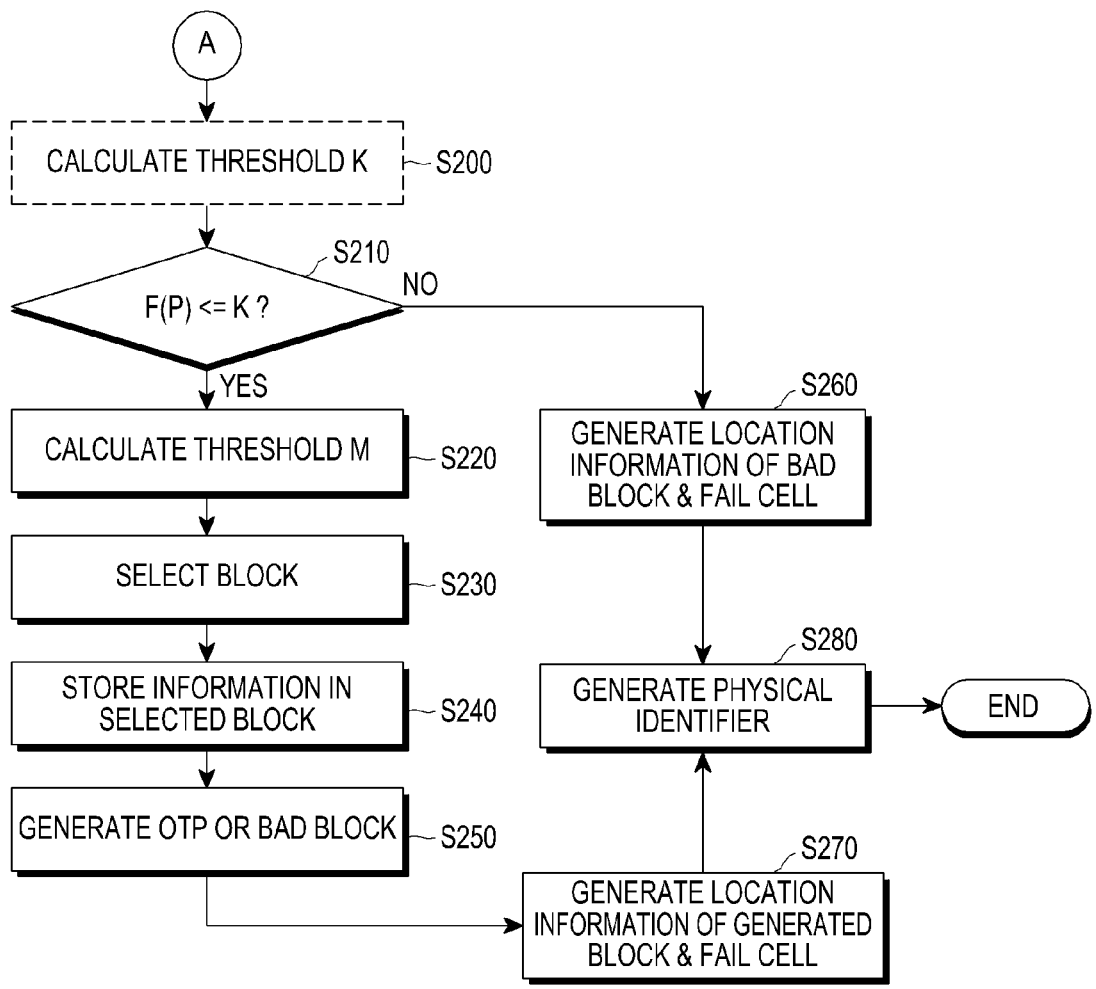

FIGS. 1 and 2 are flowcharts illustrating a method for generating a physical identifier according to an embodiment of the present invention.

Referring to FIG. 1, in step S100, the storage device is manufactured. In step S110, variables are initiated. In step S120, a variable I is increased. In step S130, a program/erasing test is performed. In step S140, an attempt to identify program and erasing status data is performed. If step S140 is unsuccessful, in step S170, a variable N is increased by 1. However, if step S140 is successful, in step S150, a read disturbance test is performed. In step S160, an ECC allowance threshold is compared to a number of fail cells. If the number of fail cells is greater than the ECC threshold, the method returns to step S170. However, if the number of fail cells is less than or equal to the ECC allowance threshold, in step S180, a block number is identified. In step S190, a generation ratio of the bad blocks is calculated. The generation ratio 'P' is the ratio of the number of failures 'N' to the total number of blocks.

Referring to FIG. 2, the method of FIG. 1 proceeds from step S190 to step S200, where a threshold K is calculated. In step S210, a probability 'F(P)' of generating bad blocks is compared to a value 'K'. If the generation probability F(P) is greater than K, in step S220, the number of OTP regions 'M' is calculated. In step S230, blocks are selected. In step S240, specific information is recorded or stored in the selected blocks. In step S250, the OTP region or the bad block is generated, If the generation probability F(P) is less than or equal to the threshold K, in step S260, location information of the bad block and the fail cell is generated. In step S270, location information of the generated bad block and fail cell is generated. In step S280, which follows after either of step S260 or step S270, the physical identifier is generated.

In step S100 of manufacturing the storage device, a wafer having a plurality of memory chips or storage devices is provided, and the steps S100 may be individually, sequentially, or simultaneously performed in each of the storage devices included in the wafer according to an apparatus for manufacturing the wafer. Examples of such storage devices include Non-Volatile Memories (NVM) such as a Solid State Disk (SSD) and a flash memory card. Hereinafter, embodiments of the present invention are described based on a NAND flash memory, but embodiments of the present invention are not limited thereto. Examples of the storage device include a floppy disk, a flexible disk, a hard disk, a magnetic tape, a Compact Disc Read-Only Memory (CD-ROM), an optical disk, a Blu-ray® disc, a Random Access Memory (RAM), a Programmable Read-Only Memory (PROM), an Erasable PROM (EPROM), and a flash-EPROM.

Figure 3:
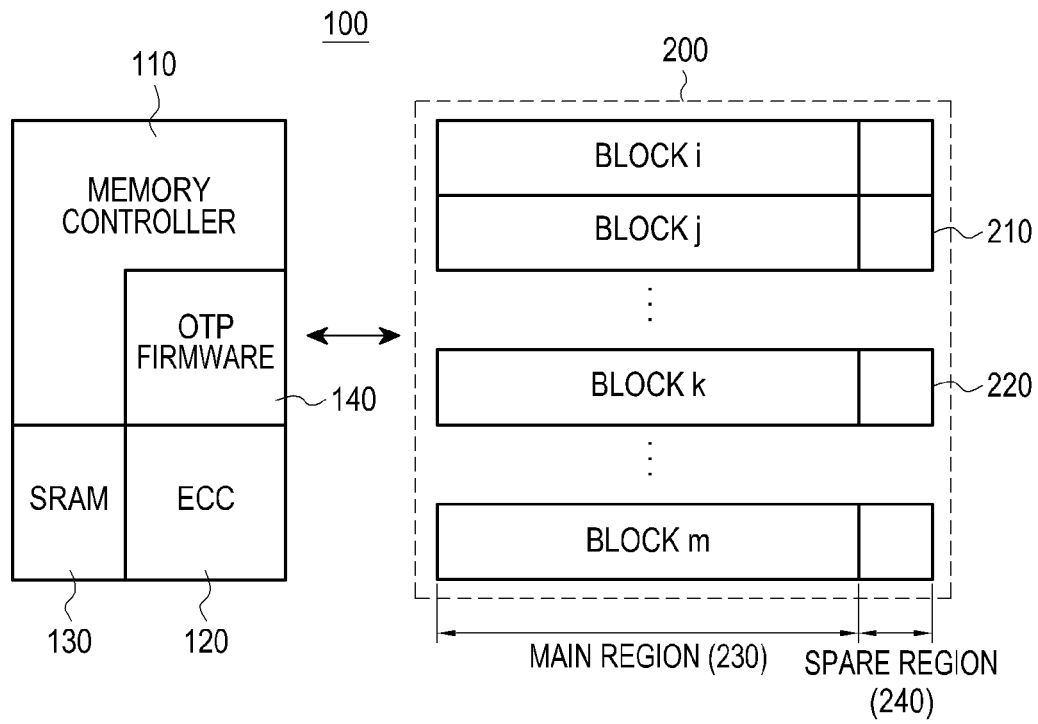
FIG. 3 is a diagram schematically illustrating a storage device having a construction according to an embodiment of the present invention.

FIG. 3 is a diagram schematically illustrating a storage device having a construction according to an embodiment of the present invention. Referring to FIG. 3, the NAND flash memory is described as an example of a storage device 100. For example, the storage device 100 can be mounted at a memory slot of a personal computer, which serves as a host device (not shown). In this example, the storage device 100 performs data communication with the host device that generates the physical identifier.

The storage device 100 communicates with a memory 200, which includes unit storage regions of the same size, and the host device. The storage device 100 provides, to the memory 200, a response to a request from the host device. The storage device 100 includes a memory controller 110 for outputting a control command, such as read, write, or erase commands, such as commands for reading, writing to, or erasing from a program. The memory controller 110 includes an Error Correcting Code (ECC) block 120 for detecting and correcting errors included in data scanned from the memory 200, a buffer RAM 130 (e.g. a Static Random Access Memory (SRAM)) for temporarily storing the data scanned from the memory 200 or data provided from the host, and an OTP firmware 140 for controlling OTP regions of the memory 200.

The memory 200 has a hierarchical structure in which cells (e.g., bits, bytes, words, etc.) constitute a page, pages constitute a block, and blocks constitute the whole memory. The term "storage region" as used in this specification, refers to divisible storage regions of the same size, for example, a page or a cell (bit, byte, word, etc.) included in the storage device 100.

The memory 200 includes a plurality of blocks 210 and 220, and can only be eliminated one block at a time. Each block has a size ranging from 64 Kbytes to 512 Kbytes. Each block includes a plurality of pages and serves as a basic unit for reading and writing. Each page has a size ranging from 512 bytes to 8 Kbytes. A NOR flash memory can read or write byte-by-byte or word-by-word. Each page has an additional data region called a spare region, a buffer region, or an Out Of Band (OOB) having a size ranging from 1 byte to hundreds of bytes. The spare region is used for recording a bad block marking, ECC data, file system information, etc. The memory 200 may include a Bad Block Table (BBT) for recording states of the whole blocks of the memory 200, and each of the blocks has a "good" state, a "bad" state, or a "reserved" state. According to embodiments of the present invention, the "reserved" state refers to a block that cannot be programmed or erased by users (except for a manufacturer of the storage device), and is read-only for the users.

The memory 200 includes blocks i to m (including block j 210 and block k 220), and each of the blocks i to m includes a main region 230 including a plurality of pages and a spare region 240 following each of the pages. Block k 220 among the blocks i to m is used for physical property information of the memory 200, and refers to a reference storage region used for uniquely identifying the storage device 100.

Technologies for detecting and correcting errors provide an efficient restoration of data damaged by various causes. For example, data may be damaged when stored in the memory or by perturbations of data transmission channels through which the data is transmitted to a destination from a source. Various methods for detecting and correcting the damaged data have been proposed. Well-known technologies for detecting the errors include a Reed-Solomon (RS) code, a hamming code, a Bose-Chaudhur i-Hocquenghem (BCH) code, a Cyclic Redundancy Code (CRC), etc. Through such codes, it is possible to detect and correct the damaged data. In most of the application fields in which non-volatile memory devices are used, source data from the host device and the ECC data are stored in the memory together. The ECC data are used for correcting errors occurring when a reading operation of the memory is performed, and the number of error bits that can be corrected by the ECC data is limited.

Referring back to FIG. 1 in more detail, in step S110 of initiating the variables, the variable I indicating the block number and the variable N indicating the number of bad blocks are set to 0 in order to track a roof for repeated iterations of steps S120 through S180.

In step S120, the block number I is increased by 1. In step S130, the memory controller 110 performs a program/erasing test block-by-block. In step S140, the memory controller 110 determines whether the test result is a failure or a success (i.e. a pass) through the status data stored in the memory. In step S170, when the test result is a failure, a corresponding block is marked as a bad block (e.g., reserved words such as "000h" are indicated in the spare region), and the variable N indicating the number of bad blocks is increased by 1.

In general, the memory 200 includes a page buffer called an access circuit, and the page buffer stores the status data generated by the performance results of a memory operation, which may be a program (writing) operation, a reading operation, or an erasing operation. The status data may include a plurality of bits, for example, bits corresponding to the page unit.

The memory controller 110 can detect fail cell locations from the status data stored in the memory 200, and mark blocks including the fail cells as bad blocks. Each of the bad blocks and a separate table including location information of the fail cell in the bad block can be stored in a certain block (preferably, a block in a reservation state).

The erasing test is described as follows with reference to FIG. 4.

Figure 4:
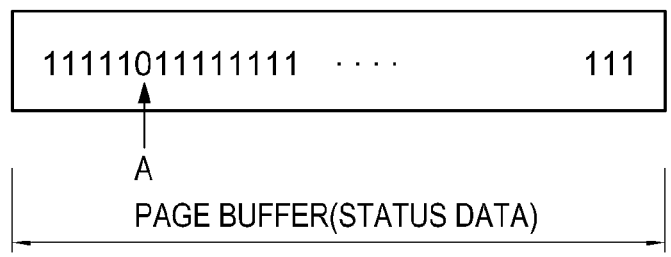
FIG. 4 is a diagram illustrating an example of status data stored in a memory according to an erasing test.

FIG. 4 is a diagram illustrating an example of the status data stored in the memory according to the erasing test. For the sake of description, it is assumed that each bit value of the status data is set to "0" before the erasing operation is started. Each bit value of the status data refers to a state (0 or 1) of a corresponding memory cell. In the erasing operation, the state of each of the memory cells, which are included in each of plural pages forming one block, become a "1" state. The fail cell generated in the erasing operation refers to a cell that is not changed into a "1" state and remains as a "0" state.

As shown in FIG. 4, only a sixth bit among all bits included in the status data remains as a "0" state, and the rest of the bits are changed into a "1" state. Therefore, the memory controller 110 can detect the fail cell location from the bit values of the status data stored in the memory 200.

The program test is described as follows with reference to FIG. 5.

Figure 5:
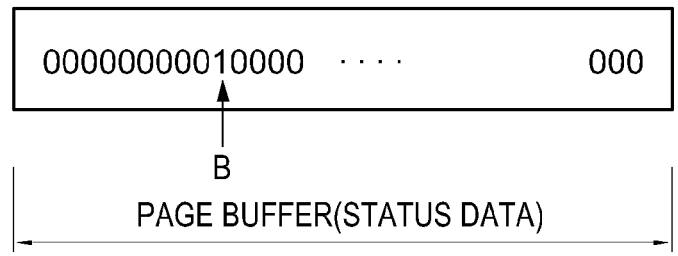
FIG. 5 is a diagram illustrating an example of status data stored in a memory according to a program test.

FIG. 5 is a diagram illustrating an example of status data stored in the memory according to the program test.

For convenience of description, it is assumed that each bit value of the status data is set to "1" before the program operation is started. The program operation is a memory operation of setting at least a part of all memory cells included in one block or page to a "0" state according to the source data. Further, in the program test, all the memory cells can be set to the "0" state. The fail cell generated in such a program operation refers to a cell that which has not changed into a "0" state and remains in a "1" state.

As shown in FIG. 5, only a sixth bit among all bits included in the status data remains in the "1" state, while the rest of the bits are changed into the "0" state. Therefore, the memory controller 110 can detect the fail cell location from the bit values of the status data stored in the memory 200.

Referring back to FIG. 1, in step S150, the memory controller 110 performs a read test page-by-page or block-by-block.

The memory controller 110 controls the memory so as to perform the read operation. The memory controller 110 transmits a read command and an address to the memory 200 according to a predetermined timing, and the memory 200 scans data from a page of a memory block corresponding to the address, in response to the read command. The scanned data is transmitted to the buffer RAM or the ECC block 120. The ECC block 120 detects read errors of the scanned data by using the ECC data stored in the spare region of the page. The ECC block 120 stores the number of error bits (i.e., fail cells) and error location information (e.g., address information) indicating a location of the generated error, in an internal register.

In step S160, the memory controller 110 determines whether the number of fail cells exceeds the predetermined ECC allowance threshold (i.e., the number of allowed fail cells) according to the information stored in the ECC block 120. When the read error is not generated, the memory controller 110 proceeds to step S180, where the block number is identified. When the number of fail cells exceeds the predetermined ECC allowance threshold, a corresponding block is marked as a bad block and, in step S170, the number of bad blocks N is increased by 1. When the number of fail cells N does not exceed the predetermined ECC allowance threshold, the memory controller 110 proceeds to step S190, where the block number is identified.

When a fail cell is found in the read disturbance test, the memory controller 110 can detect the location of the fail cell from the information stored in the ECC block 120 and store a table, which includes the location information of the fail cell in the bad block, in a certain block (preferably, a block in a reservation state).

Figure 6:
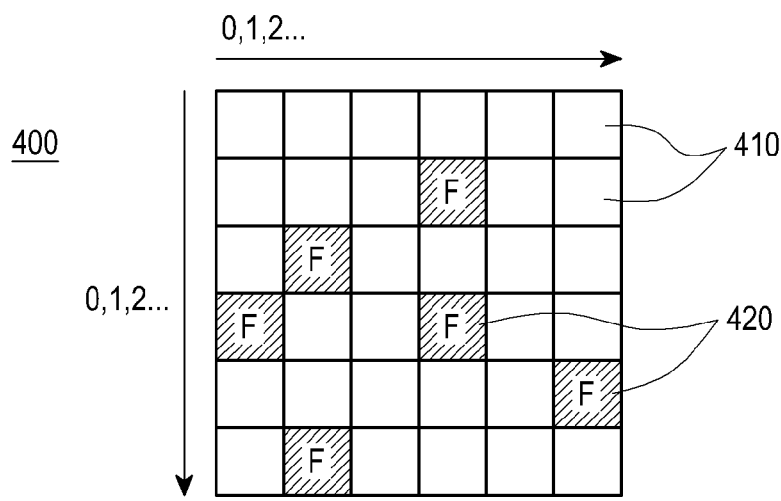
FIG. 6 is a diagram illustrating a fail cell pattern in a bad block.

FIG. 6 is a diagram illustrating a fail cell pattern in the bad block. FIG. 6 illustrates the fail cell pattern of the specific page, wherein fail cells 420 having physical defects are indicated as "F" in the illustrated 6*6 cell arrays 410 and 420.

Referring back to FIG. 1, in step S180, the memory controller 110 determines whether a value of the block number I is the same as the total number of blocks of the memory. When a test of all of the blocks has been is completed, the memory controller 110 proceeds to calculating the generation ratio of the bad blocks in step S190. When the test of all of the whole blocks has not yet been completed, the memory controller 110 proceeds to step S120, where the variable I is increased by 1.

In step S190, the memory controller 110 calculates P=N/I, which is the generation ratio of the bad blocks. More specifically, the generation ratio is determined as a value obtained by dividing the total number of blocks by the number of bad blocks. Meanwhile, according to an embodiment of the present invention, the generation ratio of the bad blocks is calculated, in order to set the appropriate number of OTP regions in consideration of the total number of blocks (i.e., the entire memory capacity). However, the generation ratio or the number of OTP regions may be set randomly. Further, the total number of bad blocks and the total number of OTP regions may be set in advance, and a value, which is obtained by subtracting the number of generated bad blocks from the total number of whole bad blocks and whole OTP regions, may be then set as the number of OTP regions for the physical identifier.

Referring back to FIG. 2 in more detail, in step S200, the memory controller 110 calculates the threshold K in consideration of a probability that a pair of regions corresponding to certain manufactured two storage devices have the same block or pattern (i.e., a location distribution). Unlike the present example, the threshold K may be a randomly set value (e.g. 1%) in accordance with embodiments of the present invention.

Figure 7:
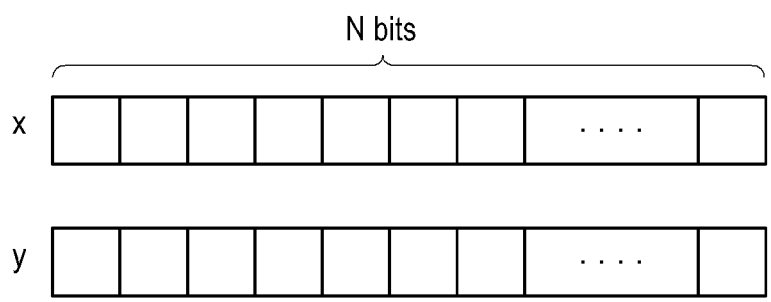
FIG. 7 is a diagram illustrating a method for setting a threshold K.

FIG. 7 is a diagram illustrating a method for setting the threshold K.

Referring to FIG. 7, Equation (1) used for calculating the threshold K is defined as follows:

$$CR = P(x=y) = (p^2 + q^2)^N \quad (1)$$

In Equation (1), CR represents an average collision ratio (i.e., a probability that a pair of regions x and y (each of the regions x and y is N bits) corresponding to the manufactured two storage devices have the same pattern), P (x=y) represents a probability that an $i^{th}$ bit of the x and an $i^{th}$ bit of the y are the same, p represents a Bit Error Rate (BER), and q=1−p. In the present example according to embodiment of the present invention, a cell corresponds to one bit.

Further, with regard to Equation (1), the following approximate Equation (2) is established:

$$X*C \sim X*X*CR \quad (2)$$

In Equation (2), X represents production, C represents an average collision probability expectation. When certain two storage devices are selected in X production, CR can be approximated to C/X.

For example, when C=1/10000, X=10⁸, and p=10$^{(-7 \sim 9)}$ in Equation (1), it is possible to obtain N, which is used for calculating the threshold K. In the present embodiment, N represents the minimum number of fail cells that can avoid the collision, and N cells can be replaced with the z number of pages or blocks including the N cells (z is a certain natural number).

Further, in Equations (1) and (2), the bit units can be replaced with block units. In such a case, N represents the minimum number of bad blocks that can avoid the collision. Similarly, the bit error rate can be replaced with a block error rate.

Embodiments of the present invention may generate a physical identifier capable of uniquely identifying the storage devices. When the physical properties collide with each other (i.e., when the physical properties are the same), errors in the physical identification can occur. Therefore, the threshold K should be set in consideration of the collision probability as described above.

In step S210, the memory controller 110 determines whether a function value F(P) for the generation probability of the bad block, which has a variable P as the generation rate of the bad block, is less than or equal to the threshold K. The function F(P) and the threshold K correspond to the generation ratio of the bad blocks and the minimum number of bad blocks, respectively, or are based on the generation ratio of the bad blocks and the minimum number of bad blocks.

When the function F(P) is larger than the threshold K, the memory controller 110 proceeds to step S260 to generate the location information of the bad block and the fail cell. The memory controller 110 generates location distribution information of the bad blocks identified in the program/erasing test and the read disturbance test, and stores the generated information in a certain block (preferably, a block in a reservation state). The memory controller 110 generates a Bad Block Table (BBT) for recording states of the whole bad blocks of the memory 200, and stores the generated table. The memory controller 110 also generates the location distribution information of the fail cells obtained by using data stored in the ECC block 120, and stores the generated information in a certain block (preferably, a block in a reservation state).

When the function F(P) is less than or equal to the threshold K, the memory controller 110 proceeds to step S220 to calculate the number of OTP regions.

In step S220, the memory controller 110 calculates M, which is the number of necessary OTP regions, in consideration of the difference between the F(P) and the threshold K.

In step S230, the memory controller 110 selects M blocks of the required OTP regions (auxiliary storage regions). In the present example, the OTP regions are described block-by-block, but the OTP regions can be designated by unit storage regions other than blocks. For example, the OTP regions can be designated page-by-page, and the physical property can be defined by the bad block pattern or the fail cell pattern. When the physical property is defined by the fail cell pattern or the combination of the bad block pattern and the fail cell pattern, the OTP regions can be designated page-by-page.

The memory controller 110 can randomly select the blocks by using a random number generator. At this time, the random selection includes a random setting of individual block locations or a random setting of a start block location or an end block location of the OTP regions. The memory controller 110 can also designate different start block locations or different end block locations for individual storage devices. Such designation is implemented by increasing or decreasing the start block locations or different end block locations step-by-step in a sequence of serial numbers of the storage devices.

As described above, by randomly selecting the block locations, the blocks randomly and differently selected for each of the products become the OTP regions, thereby reducing the collision probability of the physical property remarkably.

In step S240, the memory controller 110 can perform at least one of the several operations described as follows.

First, the memory controller 110 can generate a fail cell pattern including at least one artificial fail cell in the selected block. The generation of such a fail cell or fail cell pattern can be performed in a normal memory manufacturing device. For example, a generally known laser fuse or Electrical fuse (E-fuse) can be used. Second, the memory controller 110 can generate a random number in the selected block (i.e., randomly set a cell or bit pattern). Third, the memory controller 110 can store specific information such as a code or a secret key in the selected block.

In step S250, the memory controller 110 generates the selected block, in which the fail cell pattern is recorded as the bad block (i.e., the selected block is marked as the bad block), and the selected block, in which data are recorded, as the OTP block (e.g. designating the selected block as a block in a reservation state). The block in a reservation state cannot be programmed or erased, and can only be subjected to a reading operation.

In step S270, the memory controller 110 generates location distribution information of the bad blocks identified in the program/erasing test and the read disturbance test, artificially generated bad blocks, and the OTP regions, and stores the generated information in a certain block (preferably, a block in a reservation state). The memory controller 110 generates a Bad Block Table (BBT) recording states of the whole blocks of the memory 320, and stores the generated table. The memory controller 100 also generates the location distribution information of the fail cells obtained by using data stored in the ECC block, and stores the generated information in a certain block having a reservation state (preferably, a block in a reservation state).

According to the embodiments of the present invention, the general bad block table, the artificial bad block, the table regarding the OTP region, and the table regarding the fail cell distribution can be integrally or partially united, or maintained separately from each other. Further, the OTP region can be designated by other states as well as a "reservation" state.

Information (e.g., a table) regarding at least one of the bad blocks, the OTP region, and the fail cell pattern can be encrypted and stored in an encrypted state by using an encryption key (e.g., an encryption key provided from a license agency of the storage device) that another legitimate host device can recognize.

In step S280, the memory controller 110 generates the physical identifier regarding the storage device by using the information regarding at least one of the bad blocks, the OTP region, and the fail cell pattern.

The location information of the bad block and the OTP region, and the fail cell pattern can be represented by various methods, and the intrinsic physical identifier having a specific length can be generated by using a cryptographic technique, such as a hash function, for the representation value and additional values. Such a physical identifier is not necessarily required to have a fixed length, and the information of the bad block and the OTP region and the fail cell pattern themselves can function as the physical identifier.

For example, when the fail cell pattern is the same as that the pattern illustrated in FIG. 6, the location of each of the fail cells can be represented by x-y coordinates, such as (3,1), (1,2), and (3,3). The following values are obtained by using locations of the bad block and the selected blocks, values of a representation of the fail cell pattern, and the hash function, such as a Secure Hash Algorithm 1 (SHA-1) and a Message Digest Algorithm 5 (MD5), wherein the representation of the fail cell pattern is a table or an array for recording the x-y coordinates.

The Physical identifiers derived from a hash function applied to a combination of physical location information of the block, the representation of the fail cell pattern, and possibly other information other information.

When the storage device 100 is positioned inside or outside the host device and the storage device 100 is connected to the host device (either wired or wirelessly), the physical identifier can be used by the host device to authenticate the storage device. For example, the host device may be a personal computer and the storage device 100 may be a NAND flash memory mounted at a memory slot of the personal computer. In this case, the host device and the storage device 100 perform data communication through a bus in the host device.

Examples of the host device are not limited thereto, but other host devices according to embodiments of the present invention include a computer, a laptop, a mobile apparatus, a portable apparatus, an internet protocol television, a portable media player, a Personal Digital Assistant (PDA), etc. In the following description, the physical identifier refers to patterns of the bad block and the selected block, and the fail cell pattern.

The physical identifier can be used as authentication information. The authentication information, for example, can be expressed by Authentication_Value=(physical identifier, Signature=Sign (PK_LicenseAgency, physical identifier)). That is, the authentication information, which is Authentication_Value, may include an electronic signature value "Signature" of the physical identifier and the license agency. More specifically, the electronic signature value is a value that a hash value having a physical property is signed by the secret key of the license agency "PK_LicenseAgency." The authentication information "Authentication_Value", may be data already stored in the memory 320 or data generated by the memory controller 330 by using constructional elements stored in the memory 320, which include the secret key of the license agency (i.e., PK_LicenseAgency) and the physical identifier.

The host device can authenticate the storage device through the following two authentication information verification steps described as follows.

The first authentication information verification step corresponds to a software authentication process of the Public Key Infrastructure (PKI). In the first authentication information verification step, the host device performs a first authentication by decoding the original hash value of the physical identifier by applying the public key of the license (which has already been recognized) to the electronic signature value, calculating the hash value of the physical identifier, and then comparing the two values. The first authentication information verification step S60 is an optional step that can be omitted in accordance with other embodiments of the present invention. In the present example, a PKI is used, but certain other cryptographic schemes such as a symmetric-key encryption scheme, etc. can be used in accordance with other embodiments of the present invention.

The second authentication information verification step is a hardware authentication process, where the host device determines whether the physical identifier information and a test result of the storage device are the same or similar to each other.

Regarding the second information authentication step, first, a verification method based on the physical defects is described as follows. The host device can control the storage device so as to perform the read disturbance test, and compare error location information (e.g., address information that represents the number of error bits, i.e., fail cells, and locations where the errors are generated) with the physical identifier. In other words, the host device determines whether the test result is the same as or similar to the physical identifier information.

The host device can also control the storage device so as to perform a read disturbance test, and determine whether the test result is the same as or similar to the physical identifier information.

Subsequently, in the verification method based on the OTP region that has no physical defects, the host device determines whether the tested OTP region pattern is the same as or similar to the physical identifier information. The identification of the OTP region can be implemented based upon a determination of whether the OTP region has a "reservation" state, or whether the data pattern stored in the OTP region is the same as the predetermined pattern.

Embodiments of the present invention provide various advantages. For example, the location of the OTP region or the cell pattern is used as the physical identifier, so that the method for generating the physical identifier can be applied to all product lines regardless of the stage in the manufacturing process. Further, each product uses a differently selected random region, so that a collision probability of the physical identifier can be noticeably lowered. Further, when the generated OTP region is used for storage of certain information, individual products use different regions, respectively, so that attack complexity of code information increases, thereby enhancing safety.

Even further, a specific cell pattern (e.g., a fail cell pattern) can be formed in an artificially generated reference region, so that the specific cell pattern can be used as a fingerprint of the memory device in a hardware level authentication.

Embodiments of the present invention can be implemented by hardware, software, and a combination of the hardware and the software. For example, the software can be stored in volatile or non-volatile storage devices such as a ROM, memories such as a RAM, a memory chip, a device or an integrated circuit, and optically or magnetically recordable and machine-readable storage media such as a CD, a Digital Versatile Disc (DVD), a magnetic disk, a magnetic tape, etc., in re-writable or fixed formats. A storage unit, which can be included in the host device, is an example of a program including instructions for implementation of the embodiments of the present invention or the machine-readable storage media suitable for storing the programs. Therefore, embodiments of the present invention may include a program that includes a code for implementing the described systems and methods, and may further include machine-readable storage media for storing such a program. Further, the program can be electronically transferred by certain media such as a communication signal transmitted through a wired or wireless connection, and embodiments of the present invention further include various equivalents thereof.

While the present invention has been shown and described with reference to certain embodiments above, it will be understood by those skilled in the art that various changes in form and details may be made therein without departing from the spirit and scope of the invention as defined by the appended claims.

What is claimed is:

1. A method for generating a physical identifier in a storage device that includes a plurality of storage regions, the method comprising:
    Determining, by a host device, a number of reference storage regions for uniquely identifying the storage device;
    comparing, by the host device, the number of reference storage regions to a threshold;
    generating, by the host device, auxiliary storage regions for uniquely identifying the storage device, such that a number of the auxiliary storage regions is determined based on a difference between a function value of the number of reference storage regions and the threshold;
    generating, by the host device, location distribution information of the reference storage regions and auxiliary storage regions; and
    storing, by the host device, the location distribution information in the storage device,
    wherein each of the reference storage regions and auxiliary storage regions is a block of memory in the storage device.

2. The method as claimed in claim 1, wherein both the reference storage regions and the auxiliary storage regions are bad blocks.

3. The method as claimed in claim 1, wherein the reference storage regions are bad blocks, and the auxiliary storage regions are read-only storage blocks.

4. The method as claimed in claim 1, wherein both the reference storage regions and the auxiliary storage regions are read-only storage blocks.

5. The method as claimed in claim 1, wherein determining the number of reference storage regions comprises:
    determining bad blocks having program or erasing errors among the plurality of storage regions; and
    determining bad blocks having read errors among the plurality of storage regions.

6. The method as claimed in claim 1, further comprising encrypting the location distribution information, wherein the encrypted location distribution information is stored in the storage device.

7. The method as claimed in claim 1, wherein the auxiliary storage regions are regions randomly selected from among the plurality of storage regions.

8. A non-transitory machine-readable storage medium recording a program for execution of a method for generating a physical identifier in a storage device that includes a plurality of storage regions, the method comprising:
    determining, by a host device, a number of reference storage regions for uniquely identifying the storage device;
    comparing, by the host device, the number of reference storage regions to a threshold;
    generating, by the host device, auxiliary storage regions for uniquely identifying the storage device, such that a number of the auxiliary storage regions is determined based on a difference between a function value of the number of reference storage regions and the threshold;
    generating, by the host device, location distribution information of the reference storage regions and auxiliary storage regions; and
    storing, by the host device, the location distribution information in the storage device,
    wherein each of the reference storage regions and auxiliary storage regions is a block of memory in the storage device.

9. The machine-readable storage medium as claimed in claim 8, wherein both the reference storage regions and the auxiliary storage regions are bad blocks.

10. The machine-readable storage medium as claimed in claim 8, wherein the reference storage regions are bad blocks, and the auxiliary storage regions are read-only storage blocks.

11. The machine-readable storage medium as claimed in claim 8, wherein both the reference storage regions and the auxiliary storage regions are read-only storage blocks.

12. The machine-readable storage medium as claimed in claim 8, wherein determining the number of reference storage regions comprises:
    determining bad blocks having program or erasing errors among the plurality of storage regions; and
    determining bad blocks having read errors among the plurality of storage regions.

13. The machine-readable storage medium as claimed in claim 8, further comprising encrypting the location distribution information, wherein the encrypted location distribution information is stored in the storage device.

14. The machine-readable storage medium as claimed in claim 8, wherein the auxiliary storage regions are regions randomly selected from among the plurality of storage regions.

15. A host device for generating a physical identifier comprising:
- a storage device including a plurality of storage regions; and
- at least one controller for determining a number of reference storage regions for uniquely identifying the storage device, comparing the number of reference storage regions to a threshold, generating auxiliary storage regions for uniquely identifying the storage device, such that a number of the auxiliary storage regions is determined based on a difference between a function value of the number of reference storage regions and the threshold, generating location distribution information of the reference storage regions and auxiliary storage regions, and storing the location distribution information in the storage device,
- wherein each of the reference storage regions and auxiliary storage regions is a block of memory in the storage device.

* * * * *